(12) United States Patent
Lin et al.

(10) Patent No.: US 9,548,289 B2
(45) Date of Patent: Jan. 17, 2017

(54) SEMICONDUCTOR PACKAGE ASSEMBLIES WITH SYSTEM-ON-CHIP (SOC) PACKAGES

(71) Applicant: MediaTek Inc., Hsin-Chu (TW)

(72) Inventors: Tzu-Hung Lin, Zhubei (TW); Ming-Tzong Yang, Baoshan Township, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/741,796

(22) Filed: Jun. 17, 2015

(65) Prior Publication Data

US 2016/0079220 A1    Mar. 17, 2016

Related U.S. Application Data

(60) Provisional application No. 62/050,261, filed on Sep. 15, 2014, provisional application No. 62/058,158, filed on Oct. 1, 2014.

(51) Int. Cl.
*H01L 23/02* (2006.01)
*H01L 23/48* (2006.01)
(Continued)

(52) U.S. Cl.
CPC .......... *H01L 25/18* (2013.01); *H01L 23/3114* (2013.01); *H01L 23/481* (2013.01); *H01L 23/50* (2013.01);
(Continued)

(58) Field of Classification Search
CPC ...... H01L 25/18; H01L 25/0657; H01L 23/50; H01L 24/17; H01L 23/481; H01L 23/3114; H01L 24/49; H01L 2225/0652; H01L 2224/16227; H01L 2225/06572; H01L 2224/48227; H01L 2225/06541; H01L 2225/06562; H01L 25/043; H01L 25/0652; H01L 25/071; H01L 25/074; H01L 25/0756; H01L 25/117; H01L 2225/06513; H01L 2225/06517; H01L 23/488
(Continued)

(56) References Cited

U.S. PATENT DOCUMENTS 8,659,144 B1    2/2014 Sutardja
2010/0078635 A1    4/2010 Kuroda et al.
(Continued)

*Primary Examiner* — A. Sefer
*Assistant Examiner* — Dilinh Nguyen
(74) *Attorney, Agent, or Firm* — McClure, Qualey & Rodack, LLP

(57) ABSTRACT

The invention provides a semiconductor package assembly. The semiconductor package assembly includes a first semiconductor package. The first semiconductor package includes a first semiconductor die having first pads thereon. First vias are disposed on the first semiconductor die, coupled to the first pads. A first dynamic random access memory (DRAM) die is mounted on the first semiconductor die, coupled to the first vias. A second semiconductor package is stacked on the first semiconductor package. The second semiconductor package includes a body having a die-attach surface and a bump-attach surface opposite to the die-attach surface. A second dynamic random access memory (DRAM) die is mounted on the die-attach surface, coupled to the body through the bonding wires. The number of input/output (I/O) pins of first DRAM die is different from the number of input/output (I/O) pins of the second DRAM die.

22 Claims, 2 Drawing Sheets

(51) Int. Cl.
| | |
|---|---|
| H01L 23/52 | (2006.01) |
| H01L 29/40 | (2006.01) |
| H01L 23/34 | (2006.01) |
| H01L 25/18 | (2006.01) |
| H01L 25/065 | (2006.01) |
| H01L 25/10 | (2006.01) |
| H01L 23/31 | (2006.01) |
| H01L 23/50 | (2006.01) |
| H01L 23/00 | (2006.01) |
| H05K 1/11 | (2006.01) |
| H05K 1/18 | (2006.01) |

(52) U.S. Cl.
CPC .............. *H01L 24/17* (2013.01); *H01L 24/49* (2013.01); *H01L 25/0652* (2013.01); *H01L 25/0655* (2013.01); *H01L 25/0657* (2013.01); *H01L 25/10* (2013.01); *H01L 25/105* (2013.01); *H05K 1/112* (2013.01); *H05K 1/181* (2013.01); *H01L 2224/0237* (2013.01); *H01L 2224/04105* (2013.01); *H01L 2224/12105* (2013.01); *H01L 2224/16146* (2013.01); *H01L 2224/16225* (2013.01); *H01L 2224/16227* (2013.01); *H01L 2224/32145* (2013.01); *H01L 2224/48091* (2013.01); *H01L 2224/48227* (2013.01); *H01L 2224/73209* (2013.01); *H01L 2224/73265* (2013.01); *H01L 2225/0651* (2013.01); *H01L 2225/0652* (2013.01); *H01L 2225/06541* (2013.01); *H01L 2225/06562* (2013.01); *H01L 2225/06572* (2013.01); *H01L 2225/1035* (2013.01); *H01L 2225/1041* (2013.01); *H01L 2225/1058* (2013.01); *H01L 2924/1431* (2013.01); *H01L 2924/1436* (2013.01); *H01L 2924/15311* (2013.01); *H01L 2924/181* (2013.01); *H01L 2924/18161* (2013.01); *H01L 2924/18162* (2013.01)

(58) Field of Classification Search
USPC .......................... 257/686, 777, 723, 778, 774
See application file for complete search history.

(56) References Cited

U.S. PATENT DOCUMENTS

| | | |
|---|---|---|
| 2010/0109138 A1 | 5/2010 | Cho |
| 2011/0133327 A1 | 6/2011 | Hsu et al. |
| 2011/0304015 A1* | 12/2011 | Kim ..................... H01L 23/552 257/532 |
| 2012/0083073 A1 | 4/2012 | Tanuma et al. |
| 2013/0234322 A1* | 9/2013 | Pendse .................... H01L 24/96 257/737 |
| 2014/0159231 A1* | 6/2014 | Lundberg ............... B82Y 10/00 257/737 |

* cited by examiner

SEMICONDUCTOR PACKAGE ASSEMBLIES WITH SYSTEM-ON-CHIP (SOC) PACKAGES

CROSS REFERENCE TO RELATED APPLICATIONS

This application claims the benefit of U.S. Provisional Application No. 62/050,261 filed Sep. 15, 2014, and U.S. Provisional Application No. 62/058,158 filed Oct. 1, 2014, the entirety of which are incorporated by reference herein, the entirety of which are incorporated by reference herein.

BACKGROUND OF THE INVENTION

Field of the Invention

The present invention relates to a semiconductor package assembly, and in particular to a hybrid dynamic random access memory (DRAM) package assembly.

Description of the Related Art

Package-on-package (PoP) package assembly is an integrated circuit packaging method to combine vertically discrete system-on-chip (SOC) and memory packages. Two or more packages are installed atop each other, i.e. stacked, with a standard interface to route signals between them. This allows higher component density in devices, such as mobile phones, personal digital assistants (PDA), and digital cameras.

For memory applications with increased levels of integration as well as improved performance, bandwidth, latency, power, weight and form factor, the signal pad to ground pad ratio becomes important in improving the coupling effect.

Thus, a novel semiconductor package assembly is desirable.

BRIEF SUMMARY OF THE INVENTION

A semiconductor package assembly is provided. An exemplary embodiment of a semiconductor package assembly includes a first semiconductor package. The first semiconductor package includes a first semiconductor die having first pads thereon. First vias are disposed on the first semiconductor die, coupled to the first pads. A first dynamic random access memory (DRAM) die is mounted on the first semiconductor die, coupled to the first vias. A second semiconductor package is stacked on the first semiconductor package. The second semiconductor package includes a body having a die-attach surface and a bump-attach surface opposite to the die-attach surface. A second dynamic random access memory (DRAM) die is mounted on the die-attach surface, coupled to the body through the bonding wires. The number of input/output (I/O) pins of first DRAM die is different from the number of input/output (I/O) pins of the second DRAM die.

Another exemplary embodiment of a semiconductor package assembly includes a first semiconductor package. The first semiconductor package includes a semiconductor die having pads thereon. First vias are disposed on the first semiconductor die, coupled to the pads. A second semiconductor package is stacked on the first semiconductor package. The second semiconductor package includes a body having a die-attach surface and a bump-attach surface opposite to the die-attach surface. A first dynamic random access memory (DRAM) die is mounted on the bump-attach surface, coupled to the body. A second dynamic random access memory (DRAM) die is mounted on the die-attach surface, coupled to the body through the bonding wires. The number of input/output (I/O) pins of first DRAM die is different from the number of input/output (I/O) pins of the second DRAM die.

Yet another exemplary embodiment of a semiconductor package assembly includes a system-on-chip (SOC) package. The SOC package includes a logic die having first pads thereon. A first redistribution layer (RDL) structure is coupled to the logic die. A molding compound surrounds the logic die, being in contact with the first RDL structure and the logic die. A dynamic random access memory (DRAM) package is stacked on the SOC package. The DRAM package includes a body having a die-attach surface and a bump-attach surface opposite to the die-attach surface. A dynamic random access memory (DRAM) die is mounted on the die-attach surface, coupled to the body through the bonding wires. One of the SOC package and the DRAM package further includes an additional dynamic random access memory (DRAM) die embedded therein. The additional DRAM die has through silicon via (TSV) interconnects formed through the additional DRAM die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
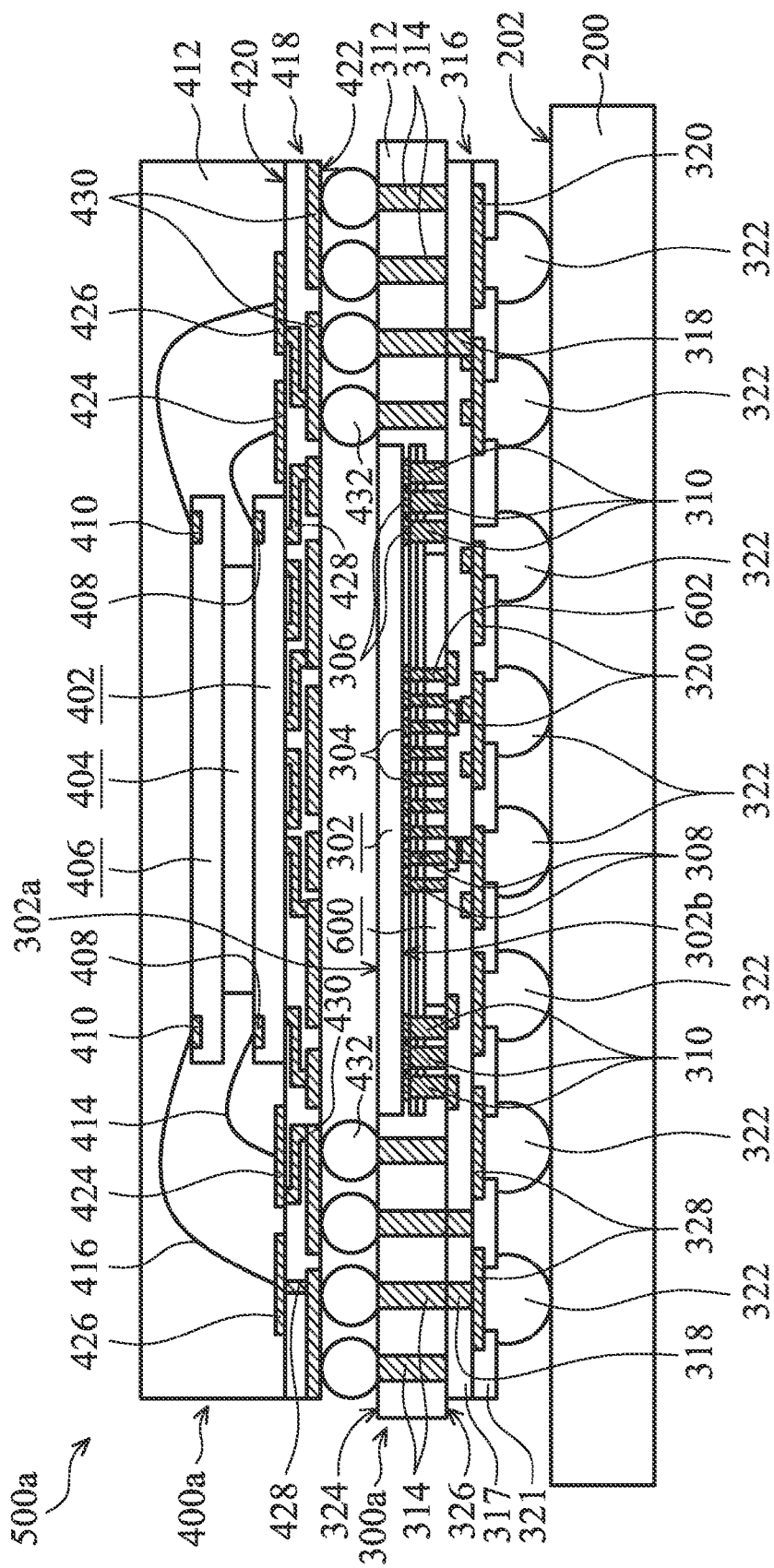
FIG. 1 is a cross-sectional view of a semiconductor package assembly including a hybrid system-on-chip (SOC) package and a dynamic random access memory (DRAM) package stacked thereon in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a cross-sectional view of a semiconductor package assembly 500a including a hybrid system-on-chip (SOC) package 300a and a dynamic random access memory (DRAM) package 400a stacked thereon in accordance with some embodiments of the disclosure. In some embodiments, the semiconductor package assembly 500a is a package-on-package (POP) semiconductor package assembly. The semiconductor package assembly 500a includes at least two vertically stacked wafer-level semiconductor packages mounted on a base 200. In this embodiment, the vertically stacked wafer-level semiconductor packages include a hybrid system-on-chip (SOC) package 300a and a dynamic random access memory (DRAM) package 400a vertically stacked thereon.

As shown in FIG. 1, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise signal trace segments or ground trace segments, which are used for the input/output (I/O) connections of the SOC package 300a and the DRAM package 400a. Also, the SOC package 300a is mounted directly on the conductive traces. In some other embodiments, the pads are disposed on the die-attach surface 202, connected to different terminals of the conductive traces. The pads are used for the SOC package 300a mounted directly thereon.

As shown in FIG. 1, the hybrid SOC package 300a is mounted on the die-attach surface 202 of the base 200 by a bonding process. The hybrid SOC package 300a is mounted on the base 200 through the conductive structures 322. The hybrid SOC package 300a is a three-dimensional (3D) semiconductor package including a system on chip (SOC) die 302, a dynamic random access memory (DRAM) die 600 and a redistribution layer (RDL) structure 316. For example, the system on chip (SOC) die 302 may include a logic die including a central processing unit (CPU), a graphic processing unit (GPU), a dynamic random access memory (DRAM) controller or any combination thereof. The dynamic random access memory (DRAM) die 600 may include a Wide I/O DRAM die, vertically stacked on the SOC die 302. In this embodiment, the DRAM die 600 of the hybrid SOC package 300a is fabricated by the through silicon via (TSV) technology. The SOC die 302 and the DRAM die 600 of the hybrid SOC package 300a are connected to each other and/or to the redistribution layer (RDL) structure 316 by vias (such as vias 308, 310). It should be noted that the number of SOC dies 302 and the number of DRAM dies 600 are not limited to the disclosed embodiment.

As shown in FIG. 1, the SOC die 302 has a back surface 302a and a front surface 302b. The SOC die 302 is fabricated by a flip-chip technology. The back surface 302a of the SOC die 302 is close to or aligned with the top surface 324 of the hybrid SOC package 300a. Pads 304 of the SOC die 302 are disposed on the front surface 302b to be electrically connected to the circuitry (not shown) of the SOC die 302. In some embodiments, the pads 304 belong to the uppermost metal layer of the interconnection structure (not shown) of the SOC die 302. The pads 304 of the SOC die 302 are in contact with the corresponding vias 308.

As shown in FIG. 1, the DRAM die 600 is stacked on the front surface 302b of the SOC die 302. The DRAM die 600 is coupled to the pads 304 of the SOC die 302 through the vias 308 disposed on the SOC die 302. The DRAM die 600 may include TSV interconnects 602 formed through the DRAM die 600. The TSV interconnects 602 arranged as an array are used to transmit input/output (I/O), ground or power signals from the DRAM die 600 to the SOC die 302 and/or the base 200. The TSV interconnects 602 may be designed to follow the pin assignment rule (such as JEDEC Wide I/O Memory specification). It should be noted that the number of TSV interconnects in the array is defined by design for the DRAM die 600 and the SOC die 302 mounted thereon and the scope of the disclosure is not limited. The vias 308 are coupled to the TSV interconnects 602.

As shown in FIG. 1, the hybrid SOC package 300a further includes a molding compound 312 surrounding the SOC die 302 and the DRAM die 600, and filling any gaps around the SOC die 302 and the DRAM die 600. The molding compound 312 is in contact with the SOC die 302 and the DRAM die 600. The molded compound 312 also cover the top surface 302b of the SOC die 302. In some embodiments, the molded compound 312 may be formed of a nonconductive material, such as an epoxy, a resin, a moldable polymer, or the like. The molding compound 312 may be applied while substantially liquid, and then may be cured through a chemical reaction, such as in an epoxy or resin. In some other embodiments, the molding compound 312 may be an ultraviolet (UV) or thermally cured polymer applied as a gel or malleable solid capable of being disposed around the SOC die 302 and the DRAM die 600, and then may be cured through a UV or thermally curing process. The molding compound 312 may be cured with a mold.

As shown in FIG. 1, the hybrid SOC package 300a further includes a redistribution layer (RDL) structure 316 is disposed on the DRAM die 600 and the SOC die 302, so that the DRAM die 600 is between the SOC die 302 and the RDL structure 316. The RDL structure 316 may be in contact with the molding compound 312 and the TSV interconnects 602 of the DRAM die 600. In some embodiments, the RDL structure 316 may have one or more conductive traces 318 disposed in one or more intermetal dielectric (IMD) layers 317. The conductive traces 318 are electrically connected to corresponding RDL contact pads 320. The RDL contact pads 320 are exposed to openings of the solder mask layer 321. However, it should be noted that the number of conductive traces 318, the number of IMD layers 317 and the number of RDL contact pads 320 shown in FIG. 1 is only an example and is not a limitation to the present invention.

As shown in FIG. 1, the hybrid SOC package 300a further includes conductive structures 322 disposed on a surface of the RDL structure 316 away from the DRAM die 600 and the SOC die 302. The conductive structures 322 are coupled to the conductive traces 318 through the RDL contact pads 320. In some embodiments, the conductive structures 322 may comprise a conductive bump structure such as a copper bump or a solder bump structure, a conductive pillar structure, a conductive wire structure, or a conductive paste structure.

As shown in FIG. 1, the DRAM die 600 uses the TSV interconnects 602 respectively connecting the pads 304 of the SOC die 302 to the conductive traces 318 of the RDL structure 316 by the vias 308. Also, pads 306 of the SOC die 302 are coupled to the conductive traces 318 of the RDL structure 316 by vias 310 passing through the molding compound 312 between the SOC die 302 and the RDL structure 316. The DRAM die 600 is surrounded by the vias 310.

As shown in FIG. 1, the conductive traces 318 may be designed to be fan out from one or more of the pads 304 and 306 of the SOC die 302 and TSV interconnects 602 of DRAM die 600 to provide electrical connections between the SOC die 302, DRAM die 600 and the RDL contact pads 320. Therefore, the RDL contact pads 320 may have a larger bond pitch than the pads 304 and 306 of the SOC die 302 and TSV interconnects 602 of DRAM die 600, and which may be suitable for a ball grid array or another package mounting system.

As shown in FIG. 1, the DRAM package 400a is stacked on the hybrid SOC package 300a by a bonding process. In one embodiment, the DRAM package 400a is a low-power double data rate DRAM (LPDDR DRAM) package following the pin assignment rule (such as JEDEC LPDDR I/O Memory specification). The DRAM package 400a includes a body 418 and at least one LPDDR DRAM die, for example, three LPDDR DRAM dies 402, 404 and 406, stacked thereon. The body 418 has a die-attach surface 420 and a bump-attach surface 422 opposite to the die-attach surface 420. In some embodiments, the number of input/output (I/O) pins of Wide I/O DRAM die 600 is designed to be different from the number of input/output (I/O) pins of each of the LPDDR DRAM dies 402, 404 and 406. In one embodiment, the number of input/output (I/O) pins of Wide I/O DRAM die 600 is eight times greater than the number of input/output (I/O) pins of each of the LPDDR DRAM dies 402, 404 and 406. In this embodiment, as shown in FIG. 1, there are three LPDDR DRAM dies 402, 404 and 406 mounted on the die-attach surface 420 of the body 418. The LPDDR DRAM die 404 is stacked on the LPDDR DRAM die 402 through a paste (not shown), and the LPDDR DRAM die 406 is stacked on the LPDDR DRAM die 404 through a paste (not shown). The LPDDR DRAM dies 402, 404 and 406 may be coupled to the body 418 by bonding wires, for example bonding wires 414 and 416. However, the number of stacked DRAM devices is not limited to the disclosed embodiment. Alternatively, the three LPDDR DRAM dies 402, 404 and 406 as shown in FIG. 1 can be arranged side by side. Therefore, the LPDDR DRAM dies 402, 404 and 406 are mounted on die-attach surface 420 of the body 418 by paste. The body 418 may comprise circuitry 428 and metal pads 424 and 426 and 430. The metal pads 424 and 426 are disposed on the top of the circuitry 428 close to the die-attach surface 420. The metal pads 430 are disposed on the bottom of the circuitry 428 close to the bump-attach surface 430. The circuitry 428 of the DRAM package 400a is interconnected with the conductive traces 318 of the RDL structure 316 via a plurality of conductive structures 432 disposed on the bump-attach surface 422 of the body 418. In some embodiments, the conductive structures 432 may comprise a conductive bump structure such as a copper bump or a solder bump structure, a conductive pillar structure, a conductive wire structure, or a conductive paste structure. In some embodiments, the DRAM package 400a is coupled to the conductive traces 318 of the RDL structure 316 by the vias 314 passing through the molding compound 312 between the DRAM package 400a and the RDL structure 316 of the hybrid SOC package 300a. The SOC die 302 and the DRAM die 600 are surrounded by the vias 314.

In one embodiment, as shown in FIG. 1, the DRAM package 400a further includes a molding material 412 covering the die-attach surface 420 of the body 418, encapsulating the LPDDR DRAM dies 402, 404 and 406, the bonding wires 414 and 416.

Figure 2:
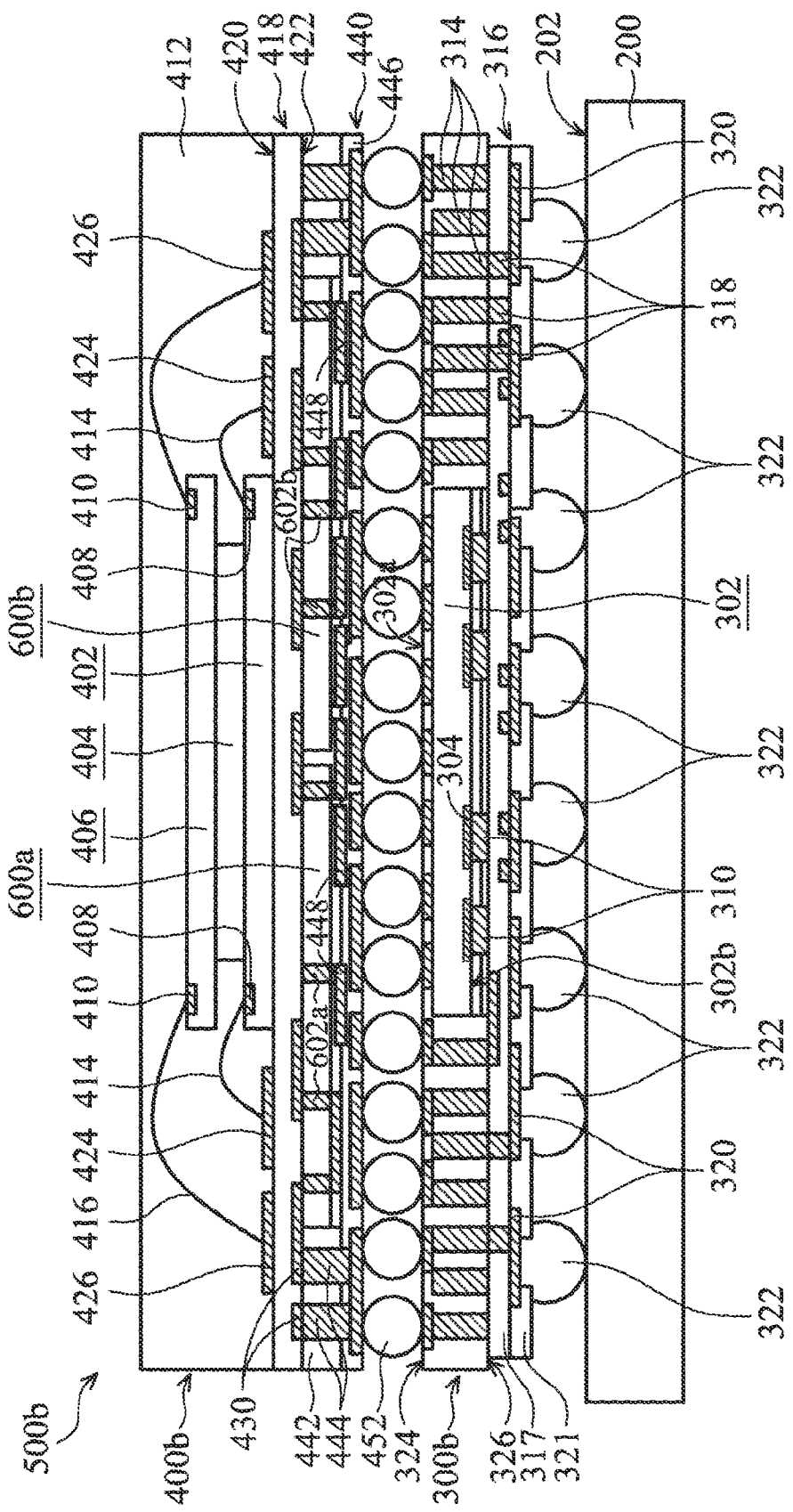
FIG. 2 is a cross-sectional view of a semiconductor package assembly including a system-on-chip (SOC) package and a hybrid dynamic random access memory (DRAM) package stacked thereon in accordance with some embodiments of the disclosure.

FIG. 2 is a cross-sectional view of a semiconductor package assembly 500b including a system-on-chip (SOC) package 300b and a hybrid dynamic random access memory (DRAM) package 400b stacked thereon in accordance with some embodiments of the disclosure. Elements of the embodiments hereinafter, that are the same or similar as those previously described with reference to FIG. 1, are not repeated for brevity. The differences between the semiconductor package assembly 500a and the semiconductor package assembly 500b is that the semiconductor package assembly 500b includes a pure system-on-chip (SOC) package 300b and a hybrid DRAM package 400b vertically stacked thereon.

As shown in FIG. 2, the SOC package 300b is a semiconductor package including a system on chip (SOC) die 302 and a redistribution layer (RDL) structure 316. The SOC package 300b does not include any DRAM die integrated therein. The SOC die 302 of the SOC package 300b is connected to the redistribution layer (RDL) structure 316 by vias (such as vias 310). The pads 304 of the SOC die 302 are in contact with the corresponding vias 308. It should be noted that the number of SOC dies 302 is not limited to the disclosed embodiment.

As shown in FIG. 2, the hybrid DRAM package 400b is stacked on the SOC package 300b by the bonding process. The hybrid DRAM package 400b is a three-dimensional (3D) semiconductor package including a wire bonding DRAM package stacked on a TSV DRAM package. In this embodiment, the hybrid DRAM package 400b is a LPDDR DRAM/Wide I/O DRAM hybrid package including LPDDR DRAM dies following a specific pin assignment rule (such as JEDEC LPDDR I/O Memory specification) and Wide I/O DRAM dies following another specific pin assignment rule (such as JEDEC Wide I/O Memory specification). The hybrid DRAM package 400b includes a body 418, at least one LPDDR DRAM die and at least one Wide I/O DRAM die stacked on the body 418. In some embodiments as shown in FIG. 2, there are three LPDDR DRAM dies 402, 404 and 406 mounted on the die-attach surface 420 of the body 418. The LPDDR DRAM die 404 is stacked on the LPDDR DRAM die 402 through a paste (not shown), and the LPDDR DRAM die 406 is stacked on the LPDDR DRAM die 404 through a paste (not shown). The LPDDR DRAM dies 402, 404 and 406 may be coupled to the body 418 by bonding wires, for example bonding wires 414 and 416. However, the number of stacked LPDDR DRAM dies is not limited to the disclosed embodiment. Alternatively, the three LPDDR DRAM dies 402, 404 and 406 as shown in FIG. 1 can be arranged side by side. Therefore, the LPDDR DRAM dies 402, 404 and 406 are mounted on die-attach surface 420 of the body 418 by paste.

In one embodiment, as shown in FIG. 2, the body 418 may comprise circuitry (not shown) and metal pads 424 and 426 and 430. The metal pads 424 and 426 are disposed on the top of the circuitry 428 close to the die-attach surface 420. The metal pads 430 are disposed on the bottom of the circuitry 428 close to the bump-attach surface 430.

In one embodiment, as shown in FIG. 2, the hybrid DRAM package 400b further includes a molding material 412 covering the die-attach surface 420 of the body 418, encapsulating the LPDDR DRAM dies 402, 404 and 406, the bonding wires 414 and 416.

As shown in FIG. 2, the hybrid DRAM package 400b further includes at least one Wide I/O DRAM die, for example, two Wide I/O DRAM dies 600a and 600b, embedded therein. In this embodiment, there are two Wide I/O DRAM dies 600a and 600b mounted on the bump-attach surface 422, coupled to the metal pads 430 of the body 418. The Wide I/O DRAM dies 600a and 600b are arranged side by side. However, the number and the arrangement of stacked Wide I/O DRAM dies are not limited to the disclosed embodiment. The Wide I/O DRAM dies 600a and 600b may include corresponding TSV interconnects 602a and 602b formed through the Wide I/O DRAM dies 600a and 600b, respectively. The TSV interconnects 602a and 602b arranged as an array are used to transmit input/output (I/O), ground or power signals from the Wide I/O DRAM dies 600a and 600b to the LPDDR DRAM dies 402, 404 and 406 and/or the base 200. The TSV interconnects 602a and 602b may be designed to follow the pin assignment rule (such as JEDEC Wide I/O Memory specification). It should be noted that the number of TSV interconnects in the array is defined by design for the Wide I/O DRAM dies 600a and 600b and the LPDDR DRAM dies 402, 404 and 406 mounted thereon and the scope of the disclosure is not limited. The TSV interconnects 602 are coupled to the metal pads 430 of the body 418. In some embodiments, the number of input/output (I/O) pins of Wide I/O DRAM dies 600a and 600b are designed to be different from the number of input/output (I/O) pins of each of the LPDDR DRAM dies 402, 404 and 406. In one embodiment, the number of input/output (I/O) pins of Wide I/O DRAM dies 600a and 600b are eight times greater than the number of input/output (I/O) pins of each of the LPDDR DRAM dies 402, 404 and 406.

As shown in FIG. 2, the hybrid DRAM package 400b further includes a molding compound 442 disposed on the bump-attach surface 422 of the body 418. The molding compound 442 surrounds the Wide I/O DRAM dies 600a and 600b, and filling any gaps around the Wide I/O DRAM dies 600a and 600b. The molding compound 442 is in contact with the Wide I/O DRAM dies 600a and 600b.

As shown in FIG. 2, the hybrid DRAM package 400b further includes a redistribution layer (RDL) structure 440 on the bump-attach surface 422 of the body 418. The RDL structure 440 is also disposed on the LPDDR DRAM dies 402, 404 and 406 and the Wide I/O DRAM dies 600a and 600b. The Wide I/O DRAM dies 600a and 600b is between the body 418 and the RDL structure 440. The RDL structure 440 may be in contact with the molding compound 442 and the TSV interconnects 602a and 602b of the DRAM dies 600a and 600b. The RDL structure 440 may have one or more conductive traces 448 disposed in one or more inter-metal dielectric (IMD) layers 446. The conductive traces 448 are electrically connected to corresponding RDL contact pads 450. However, it should be noted that the number of conductive traces 448, the number of IMD layers 446 and the number of RDL contact pads 450 shown in FIG. 1 is only an example and is not a limitation to the present invention.

As shown in FIG. 2, the LPDDR DRAM dies 402, 404 and 406 may be coupled to the RDL contact pads 450 of the RDL structure 440 by vias 444 passing through the molding compound 442 between the molding compound 442 and the RDL structure 440. The Wide I/O DRAM dies 600a and 600b are surrounded by the vias 444.

As shown in FIG. 2, the conductive traces 448 of the DRAM package 400b is interconnected with the conductive traces 318 of the RDL structure 316 of the SOC package 300b via a plurality of conductive structures 452 disposed on the RDL contact pads 450 of the RDL structure 440. In some embodiments, the conductive structures 452 may comprise a conductive bump structure such as a copper bump or a solder bump structure, a conductive pillar structure, a conductive wire structure, or a conductive paste structure. In some embodiments, the conductive structures 452 of the DRAM package 400b are coupled to the RDL structure 316 of the SOC package 300b by the vias 314 passing through the molding compound 312 between the DRAM package 400b and the RDL structure 316 of the SOC package 300b. The SOC die 302 is surrounded by the vias 314.

Embodiments provide semiconductor package assemblies 500b and 500b. Each of the semiconductor package assemblies 500b and 500b provides a LPDDR DRAM and Wide I/O DRAM hybrid memory integrated with a POP semiconductor package assembly. The POP semiconductor package assembly 500a includes a SOC/Wide I/O DRAM hybrid package 300a and a LPDDR DRAM package 400a stacked thereon. The POP semiconductor package assembly 500b includes a pure SOC package 300b and a LPDDR/Wide I/O DRAM hybrid package 400b stacked thereon. The semiconductor package assemblies 500a and 500b have advantages of the LPDDR DRAM package assembly (such as cost-effective, quick transition, and etc.) and the Wide I/O DRAM package assembly (such as high bandwidth, low power, etc.). The semiconductor package assemblies 500a and 500b may satisfy the requirements of cost-efficiency, high bandwidth, low power and quick transition.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
    a system-on-chip (SOC) package, comprising:
        a logic die having first pads thereon;
        a first redistribution layer (RDL) structure coupled to the logic die; and
        a molding compound surrounding the logic die, being in contact with the first RDL structure and the logic die; and
    a dynamic random access memory (DRAM) package stacked on the SOC package, comprising:
    a body having a die-attach surface and a bump-attach surface opposite to the die-attach surface; and
    a dynamic random access memory (DRAM) die mounted on the die-attach surface, coupled to the body through the bonding wires,
    wherein one of the SOC package and the DRAM package further comprises an additional dynamic random access memory (DRAM) die embedded therein,
    wherein the additional DRAM die has through silicon via (TSV) interconnects formed through the additional DRAM die,
    wherein the additional DRAM die is embedded in the SOC package, coupled to first vias on the first semiconductor die and the first RDL structure,
    wherein the DRAM package is coupled to the first RDL structure of the SOC package by second vias passing through the molding compound between the DRAM package and the first RDL structure, and
    wherein the logic die is surrounded by the second vias.

2. The semiconductor package assembly as claimed in claim 1, wherein a number of input/output (I/O) pins of additional DRAM die is eight times greater than a number of input/output (I/O) pins of the DRAM die.

3. The semiconductor package assembly as claimed in claim 1, wherein the SOC package comprises first vias disposed on the logic die, coupled to the first pads.

4. The semiconductor package assembly as claimed in claim 1, wherein the DRAM package comprises:
    a second redistribution layer (RDL) structure disposed on the bump-attach surface.

5. The semiconductor package assembly as claimed in claim 4, wherein the additional DRAM die is disposed between the body and the second RDL structure.

6. The semiconductor package assembly as claimed in claim 1, further comprising:
    a base, wherein the SOC package is mounted on the base through first conductive structures.

7. The semiconductor package assembly as claimed in claim 1, wherein the first DRAM die is disposed between the first semiconductor die and the RDL structure.

8. A semiconductor package assembly, comprising:
a system-on-chip (SOC) package, comprising:
a logic die having first pads thereon;
a first redistribution layer (RDL) structure coupled to the logic die; and
a molding compound surrounding the logic die, being in contact with the first RDL structure and the logic die; and
a dynamic random access memory (DRAM) package stacked on the SOC package, comprising:
a body having a die-attach surface and a bump-attach surface opposite to the die-attach surface; and
a dynamic random access memory (DRAM) die mounted on the die-attach surface, coupled to the body through the bonding wires,
wherein one of the SOC package and the DRAM package further comprises an additional dynamic random access memory (DRAM) die embedded therein,
wherein the additional DRAM die has through silicon via (TSV) interconnects formed through the additional DRAM die,
wherein the additional DRAM die is embedded in the SOC package, coupled to first vias on the first semiconductor die and the first RDL structure,
wherein the DRAM package is coupled to the first RDL structure of the SOC package by second vias passing through the molding compound between the DRAM package and the first RDL structure, and
wherein the logic die is surrounded by the second vias, wherein the molding compound is in contact with the additional DRAM die.

9. The semiconductor package assembly as claimed in claim 8, wherein a number of input/output (I/O) pins of additional DRAM die is eight times greater than a number of input/output (I/O) pins of the DRAM die.

10. The semiconductor package assembly as claimed in claim 8, wherein the SOC package comprises first vias disposed on the logic die, coupled to the first pads.

11. The semiconductor package assembly as claimed in claim 8, further comprising:
a base, wherein the SOC package is mounted on the base through first conductive structures.

12. The semiconductor package assembly as claimed in claim 8, wherein the first DRAM die is disposed between the first semiconductor die and the RDL structure.

13. The semiconductor package assembly as claimed in claim 8, wherein the DRAM package comprises:
a second redistribution layer (RDL) structure disposed on the bump-attach surface.

14. The semiconductor package assembly as claimed in claim 13, wherein the additional DRAM die is disposed between the body and the second RDL structure.

15. A semiconductor package assembly, comprising:
a system-on-chip (SOC) package, comprising:
a logic die having first pads thereon;
a first redistribution layer (RDL) structure coupled to the logic die; and
a molding compound surrounding the logic die, being in contact with the first RDL structure and the logic die; and
a dynamic random access memory (DRAM) package stacked on the SOC package, comprising:
a body having a die-attach surface and a bump-attach surface opposite to the die-attach surface; and
a dynamic random access memory (DRAM) die mounted on the die-attach surface, coupled to the body through the bonding wires,
wherein one of the SOC package and the DRAM package further comprises an additional dynamic random access memory (DRAM) die embedded therein,
wherein the additional DRAM die has through silicon via (TSV) interconnects formed through the additional DRAM die,
wherein the additional DRAM die is embedded in the SOC package, coupled to first vias on the first semiconductor die and the first RDL structure,
wherein the DRAM package is coupled to the first RDL structure of the SOC package by second vias passing through the molding compound between the DRAM package and the first RDL structure, and
wherein the logic die is surrounded by the second vias, wherein the logic die is coupled to the RDL structure by third vias passing through the molding compound between the logic die and the first RDL structure.

16. The semiconductor package assembly as claimed in claim 15, wherein the first DRAM die is surrounded by the third vias.

17. The semiconductor package assembly as claimed in claim 15, wherein a number of input/output (I/O) pins of additional DRAM die is eight times greater than a number of input/output (I/O) pins of the DRAM die.

18. The semiconductor package assembly as claimed in claim 15, wherein the SOC package comprises first vias disposed on the logic die, coupled to the first pads.

19. The semiconductor package assembly as claimed in claim 15, further comprising:
a base, wherein the SOC package is mounted on the base through first conductive structures.

20. The semiconductor package assembly as claimed in claim 15, wherein the first DRAM die is disposed between the first semiconductor die and the RDL structure.

21. The semiconductor package assembly as claimed in claim 15, wherein the DRAM package comprises:
a second redistribution layer (RDL) structure disposed on the bump-attach surface.

22. The semiconductor package assembly as claimed in claim 21, wherein the additional DRAM die is disposed between the body and the second RDL structure.

* * * * *